United States Patent [19]

Williams, III et al.

[11] Patent Number: 4,771,472

[45] Date of Patent: Sep. 13, 1988

[54] METHOD AND APPARATUS FOR IMPROVING VOICE INTELLIGIBILITY IN HIGH NOISE ENVIRONMENTS

[75] Inventors: John M. Williams, III, Fountain Valley; Donald P. Warther, Newport Beach; Robert C. Lawson, Laguna Beach, all of Calif.

[73] Assignee: Hughes Aircraft Company, Los Angeles, Calif.

[21] Appl. No.: 38,259

[22] Filed: Apr. 14, 1987

[51] Int. Cl.$^4$ .................. H03G 3/20; H04B 1/10
[52] U.S. Cl. ...................... 381/94; 381/107; 381/110
[58] Field of Search .............. 381/94, 107, 110

[56] References Cited

U.S. PATENT DOCUMENTS

| | | | |
|---|---|---|---|
| 3,991,272 | 11/1976 | Tarr | 179/1 VL |
| 4,405,831 | 9/1983 | Michelson | 179/1 P |
| 4,410,764 | 10/1983 | Werth et al. | 364/513.5 |
| 4,430,754 | 2/1984 | Ishigaki | 381/94 |
| 4,442,546 | 4/1984 | Ishigaki | 381/94 |
| 4,461,025 | 7/1984 | Franklin | 381/56 |
| 4,466,119 | 8/1984 | Peters et al. | 381/108 |
| 4,622,692 | 11/1986 | Cole | 381/94 |
| 4,630,302 | 12/1986 | Kryter | 381/57 |

*Primary Examiner*—Howard A. Birmiel
*Attorney, Agent, or Firm*—Joseph E. Szabo; Anthony W. Karambelas

[57] ABSTRACT

The output of a noise canceling first or second order electret gradient microphone in a very high noise environment has background noise attenuated and certain phonemes shaped to improve intelligibility by means of a slow action automatic gain control circuit 22 which matches dynamic range of the microphone 10 with dynamic range of the following communication channel, and a fast action automatic gain control circuit 24 in parallel with the first circuit, that reshapes puff noise into plosive, fricative and affricative speech component signals that produced the puff noise.

37 Claims, 5 Drawing Sheets

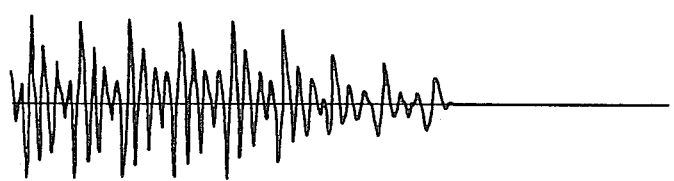

(f)

(g)

(h)

METHOD AND APPARATUS FOR IMPROVING VOICE INTELLIGIBILITY IN HIGH NOISE ENVIRONMENTS

BACKGROUND OF THE INVENTION

1. Field of the Invention

The present invention relates to improvements in intelligibility of voice signals produced by a microphone in high noise environments, and more particularly concerns background noise suppression and reshaping of certain voice component signals in the output of a microphone.

2. Description of Related Art

A class of microphones, termed first and second order gradient electret microphones, has been developed to provide noise canceling operation in noisy background environments. These microphones have been shown to produce excellent voice quality in ambient noise environments approaching 100 dBA. The microphone is often mounted as a part of a headset on a boom that extends from the side of the operator's head to the lips and is normally positioned about one inch from the lips. Intelligibility of the microphone output is high for normal voice levels when the microphone is used in this manner in high noise environments. However, in situations where the magnitude of background noise exceeds these levels, mainly in situations where background noise rises to the level of 110 to 120 dB, the operator must change the manner of use of the microphone in such a way as to seriously degrade speech intelligibility at the microphone output.

Electret gradient microphones derive their noise canceling qualities from the way they respond to audio signals emanating from areas in front of the microphone (near field response from the operator's lips) as compared to the way they respond to the signals reaching the microphone from the back or sides (far field or background noise response). The near field/far field response of an exemplary first order gradient electret microphone is illustrated in FIG. 1. The operator's voice enters the front of the microphone and follows the near response curve NR indicated in this figure whereas background noise enters the back and sides of the microphone, following the far response curve FR. The difference between these two responses, shown as a shaded area in FIG. 1, represents noise canceling ability of this class of microphones. The microphones provide excellent attenuation of noise (from 10 to 20 dB) at frequencies below about 1 kilohertz, but exhibit little noise cancellation above about 2.5 kilohertz.

When these microphones are used in very noisy environments, namely those in excess of 100 to 105 dBA, which are levels so high that the sound vibrations are literally felt as vibrations, the operator must use the microphone in a manner which quickly reduces voice quality and speed intelligibility of the microphone output. This mode of use in the very high noise environment has two major aspects which drastically affect intelligibility of the voice being conveyed in the communication channel to which the microphone output is fed. First the operator naturally raises his voice in an effort to compensate for this exceedingly noisy environment. Second, the operator places the microphone very close to his lips and may in fact place the microphone in contact with his lips. This is done in an effort to raise the signal level so that the speaker can hear his own side tones, which are fed back from the microphone to the earphones and through earplugs worn by the speaker in the very high noise environments.

This manner of use of the electret gradient microphone in very high noise environments produces two phenomena which degrade speech intelligibility. The combination of the raised voice level and close proximity of the microphone to the voice source increases the dynamic range of the microphone output beyond capabilities of current communication systems. Further, microphone output signals include certain higher amplitude components (termed "puff noise") that seriously degrade intelligibility of voice signal components in higher frequency ranges (above the noise canceling frequency range of the microphone). Puff noise is due to air flowing across the microphone element rather than to sounds generated in the creation of speech. Presently available intercommunication systems do not provide a dynamic range sufficient to handle signal levels produced by such electret microphones in very high noise environments without producing significant clipping distortion of the voice signals. Digital signal processing techniques have been tried to increase intelligibility, but these have required massive processing capability and are currently limited to the laboratory. Further, such systems are much less cost effective in producing intelligibility improvements.

Various methods have been devised for suppressing background noise in other types of microphones and other systems, including noise suppressing circuitry shown in U.S. Pat. No. 4,461,025 to Franklin, and U.S. Pat. No. 4,630,302 to Kryter, but these are operative primarily to eliminate that portion of the noise which inherently is eliminated by the operation of a first or second order gradient electret microphone itself. Such systems are not operative to suppress the puff noise contained in the output signal of a first or second order gradient electret microphone when used in very high noise environments. The prior art will not operate to attenuate or extract intelligence from puff noise in the output of such microphone due to the unique method of use of the microphone that occurs in the very high noise environment.

Accordingly, it is an object of the present invention to increase intelligibility of voice signals in high noise environments by reducing or eliminating detrimental side effects of puff noise associated with electret gradient microphones and to use such information to increase discrimination of speech components.

SUMMARY OF THE INVENTION

In carrying out principles of the present invention, in accordance with a preferred embodiment thereof, first and second AGC circuits are connected in parallel to control an attenuator that receives the microphone output signal. One of the AGC circuits has a relatively slow response to suppress background noise and the other has a relatively fast response for selectively shaping plosive sound components. According to a feature of the invention the fast AGC circuit is set to selectively operate on puff noise and to allow the system to pass the leading edge of plosive speech components with less attenuation than the attenuation imposed upon other frication sound.

BRIEF DESCRIPTION OF THE DRAWINGS

In the accompanying drawings:

FIGS. 2a-1 to 2a-4 illustrate relative amplitudes of several speech components of a microphone output with a voice at normal level;

FIGS. 2b-1 to 2b-4 illustrate the voice components of FIGS. 2a-1 to 2a-4 as they may appear at the output of an electret gradient microphone employed in a very high noise environment, without the use of the present invention;

FIGS. 2c-1 to 2c-4 illustrate microphone output in very high noise environment, but conditioned by dual AGC's;

FIG. 3 is a block diagram illustrating one implementation of the invention; and

DESCRIPTION OF A PREFERRED EMBODIMENT

Figure 1:
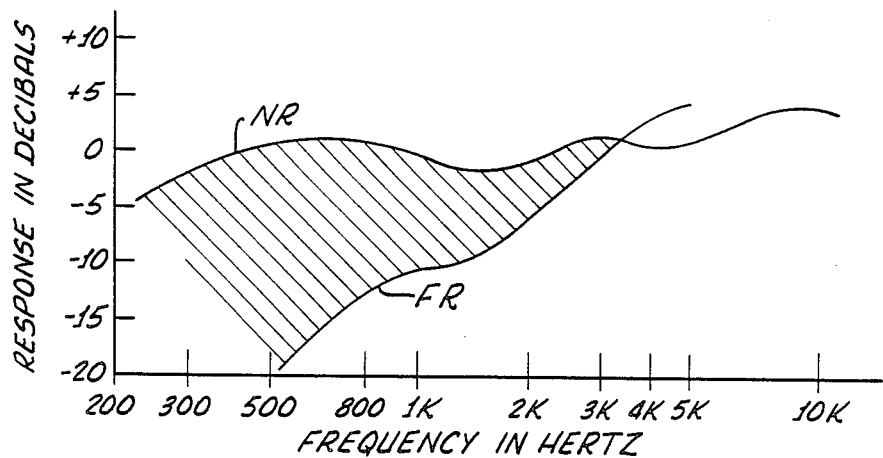
FIG. 1 illustrates the near field/far field response of a first order gradient electret microphone.

In study and analysis of the output of noise canceling electret gradient microphones used in very high noise environments, the nature and magnitude of the distortion output signal have been analyzed and found to have two more significant characteristics. It has been discovered that in addition to a greatly increased dynamic range of the output signal, caused by the raised voice and proximity of the microphone to the users lips, there is a very high level puff noise, involving higher frequencies. This puff noise is caused by certain unique characteristics of the microphone, and is at higher frequencies which are largely above those frequencies at which the microphone exhibits its noise canceling capabilities.

With respect to the increased dynamic range, under normal conditions such microphones produce rms output voltages in the range of 18 to 20 millivolts, with peak voltages in the range of 50 to 60 millivolts. When used in the very high noise environment (above about 105 dBA), it has been found that the microphones produce outputs in the range of 500 to 600 millivolts with peaks being measured at over 3.0 volts.

Communication systems into which the microphone output is fed are designed to operate with the normal signal levels, and thus cannot provide enough dynamic range to respond to the high level signals without distortion. The distortion is usually in the form of clipping due to insufficient power supply voltages in the amplifier circuits used to condition the microphone signals. When clipping or other signal distortion exceeds five to ten percent of the speech signal, intelligibility of the speech is adversely affected. For example, a circuit that normally provides a 3 volt peak voltage output under normal conditions would have to generate a 150 volt output under very high noise conditions. Circuit elements capable of handling these large voltage swings tend to be quite large, and thus are not included in most communication systems.

A second phenomenon of the microphone output has been discovered to be its uniquely increased sensitivity to "puff" noise caused by the microphone's very close proximity to the lips. The puff noise is similar to noise produced when one flows into a stage microphone, as in testing the microphone, for example. This puff noise is produced when air flows across the microphone element to thereby generate a pressure difference between the front and rear of the element. This pressure difference produces extremely high voltages across a broad frequency range, which is interpreted as a puff noise by someone listening to the signal. This puff noise is a non-audio characteristic of the microphone, and thus does not follow the near response curve NR of FIG. 1. Further, much of the energy content of the puff noise is in the frequency bands (above about 2.5 Kilohertz) where the microphone produces little or no noise cancellation on an audio response basis.

Phonemes are the smallest elements of speech. They may be created by shaping sounds emanating from the vocal chords or by shaping air flow in the mouth. Phonemes that produce the most puff noise are those including the plosives (P, T, K), fricatives (F, TH, S, SH), and the affricative (CH, as in chuch). All of these phonemes are made by shaping air flow with the lips or mouth and are not made by shaping sounds emanating from the vocal chords. Sounds so created are called frication sounds. A fricative phoneme is the result of shaping a frication sound. A plosive phoneme is similarly the result of shaping a frication sound, but is preceded by the sudden release of a pressure build up. Further, these sounds have significant frequency content in the range of about 2.5 to 6.0 Kilohertz which are used to distinguish one sound from another. The puff noise at the output of the electret gradient microphone is most predominant, and microphone noise cancellation is significantly decreased or nonexistent, in this same frequency region.

It has been found that the speech components including plosives, fricatives and affricatives, in the output signal of the electret gradient microphone used in very high noise environments, have a surprisingly high level, not only in absolute terms but relative to other speech components. In fact, in such a situation plosive, fricative, and affricative phonemes are at such a high level compared to the levels of such phonemes of regular speech signals that the human ear is unable to distinguish the difference between the several plosive, fricative and affricative phonemes. Whereas these phonemes are normally of lower amplitude than amplitude of other phonemes, such as vowels, they are at levels above the level of the vowels in the output of an electret gradient microphone used in a very high noise environment.

This problem of unusually high absolute and relative level of plosive, fricative and affricative speech components is illustrated in FIGS. 2a-1 to 2a-4, 2b-1 to 2b-4 and 2c-1 to 2c-4. Each of FIGS. 2a-1 to 2a-4, 2b-1 to 2b-4, and 2c-1 to 2c-4 comprises a simulated single wave form of a total length for each figure of 400 milliseconds. In each figure the 400 millisecond wave form is broken down into four 100 millisecond sections, each of which is shown on a different line because of the scale and excessive length of the entire 400 millisecond wave form portion. Thus, for example, with respect of FIGS. 2a-1 to 2a-4, the first 100 millisecond section of the wave form depicted therein is shown on the first line labeled FIG. 2a-1. The second 100 millisecond section of this wave form, which immediately follows the first 100 millisecond section, is shown on the second line, labeled FIG. 2b-2. The third 100 millisecond section is shown on the third line labeled FIG. 2c-3, and the fourth and final 100 millisecond section, which immediately follows the end of the third 100 millisecond section is shown on the fourth line labeled FIG. 2c-4. These wave forms show the microphone output under varying conditions. FIGS. 2a-1 to 2a-4 show the microphone output signal under quiet conditions. FIGS. 2b-1 to 2b-4 show the microphone output under very high noise conditions of about 120 dBA, used with the microphone touching the lips, and FIGS. 2c-1 to 2c-4 shows the microphone output of FIGS. 2b-1 to 2b-4 as conditioned by the dual AGC circuit described herein. Each of FIGS. 2a-1 to 2a-4, 2b-1 to 2b-4 and 2c-1 to 2c-4 depicts the same sound, "UH-TA", wherein the first syllable, "UH", is pronounced as in the word "you", and the "A" of the second syllable is a broad "A" as in "cut". Under quiet conditions the microphone output, is as shown in FIGS. 2a-1-2a-4, with the vowel sound "UH" shown on the first line, FIG. 2a-1. The speech is silent for a short interval, shown primarily at the end of FIG. 2a-1, in FIG. 2a-2, and for the beginning portion of FIG. 2a-3. This silence occurs during the pressure build up in forming the plosive phoneme "T". At point (a) in FIG. 2a-3 the plosive sound begins and is followed by a frication sound which continues through the end of the third line of FIG. 2a-3 to the point indicated as (b) in FIG. 2a-4. Thus the plosive "T" and its following frication sound are shown between points (a) and (b), at which point the broad vowel, "A", starts and continues to the end of the line of FIG. 2a-4. This sound of FIGS. 2a-1 to 2a-4 occur, as previously mentioned, under quiet conditions with the microphone about one inch from the lips and depicts vowel sound levels of between 50 and 60 dB with the frication sounds at a lower level of about 25 to 30 dB.

When the microphone is used in a very high noise environment (120 dBA for example), with the microphone touching the lips, the same speech sound illustrated in FIGS. 2a-1 to 2a-4 appear at the microphone output as illustrated in FIGS. 2b-1 to 2b-4. In FIG. 2b-1 at point (c) the vowel "UH" has terminated, and the background noise begins. The background noise continues through the entire section of the wave form shown in FIG. 2b-2 and through initial portion of the wave form of FIG. 2b-3 to point (d). At point (d) of FIG. 2b-3 the plosive "T" begins, showing a very fast rise time to a high amplitude, which is an amplitude above the amplitude of the vowel sound. High frequency frication sound continues through the rest of the wave form section of FIG. 2b-3, through an initial portion of FIG. 2b-4, and terminates at point indicated therein at (e). At this time, at point (e), the second vowel "A" starts and continues through the end of the line designated as FIG. 2b-4. In FIGS. 2b-1 to 2b-4, the vowel sounds are of very high amplitude, having a level of 90 to 95 dB, and the frication sounds are also of a very high amplitude, but still higher than the vowel sounds, having an amplitude of about 95 to 100 dB or above. Thus, not only are the frication sounds of the microphone output in the very high noise environment depicted in FIGS. 2b-1 to 2b-4 of greatly increased amplitude, but these frication sounds have an amplitude higher than the vowels, whereas in the normal sound the frication amplitudes are lower than the vowels.

According to the present invention intelligence contained in the plosive phoneme and also in fricative and affricative phonemes is retained, even in the presence of the unique phenomena of relatively increased amplitude of such puff noise, by selectively shaping the puff noise and concomitantly eliminating adverse side effects of the increased dynamic range produced by the microphone.

Figures 1, 2C:
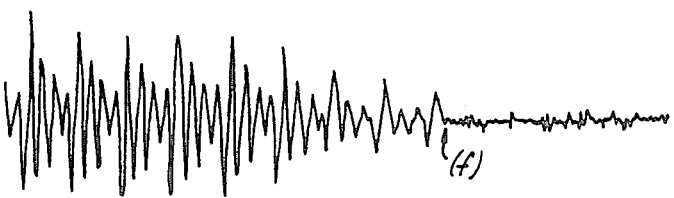
Figures 2, 2C:
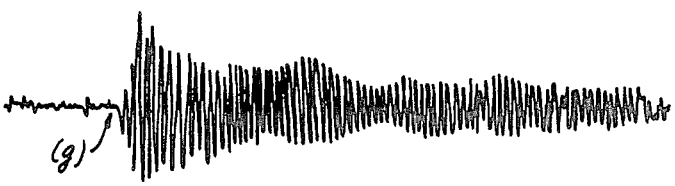
Figures 2, 2C, 3:
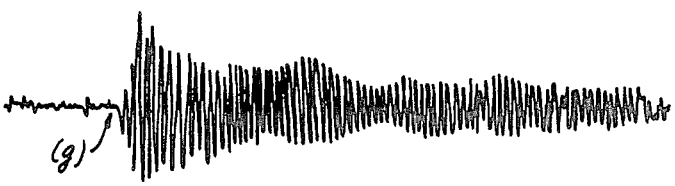
Figures 2, 2C, 3, 4:

FIGS. 2c-1 to 2c-4 show the output of a system incorporating principles of the present invention and having the dual AGC conditioning described below, but having an input from the very high noise microphone output signal depicted in FIGS. 2b-1 to 2b-4. The initial portion of FIG. 2c-1 shows the vowel "UH" and at point (f) is shown the beginning of the background noise suppressed by the low AGC circuit. The suppressed background noise continues throughout the entire wave form section of FIG. 2c-2 and through the initial section of the wave form depicted in FIG. 2c-3 until point (g). At this time the shaped plosive output from the dual AGC circuit system begins, showing the high amplitude, high rise time of the plosive, followed by a relatively attenuated lower amplitude frication sound through the end the line of FIG. 2c-3 and through the first portion of FIG. 2c-4 to a point indicated at (h), at which time the vowel "A" starts.

In the wave form depicted in FIGS. 2c-1 through 2c-4, vowel sounds have been attenuated to a level of about 45 to 50 dB, whereas the frication sounds have been still further attenuated to a level of about 35 to 45 dB. Importantly, the plosive sound has retained its shape; the leading edge of the plosive is still higher than the vowel in amplitude, but is shaped and has a following portion that is lower in amplitude than the vowel. Accordingly, there is provided at the output of the dual AGC circuit, an amplified plosive, which is of higher amplitude than the normal, relative to the vowel, but still is sufficiently shaped as to be understood. Thus, the plosive sounds, recognition of which is very important toward speech intelligibility, are shaped so as to be readily recognized (i.e. differentiated from each other and from fricative and affricative sounds), to thus greatly increase intelligibility of the output from the microphone used in very high noise environments. As will be seen below and will be understood from the discussion of time constants and gain control, frication sounds resulting from fricative or affricative phonemes and having a slower rise time than the 5 millisecond plosive rise time, (more in the order of 30 milliseconds), are merely attenuated without significant change of shape by the described circuits.

Figure 3:
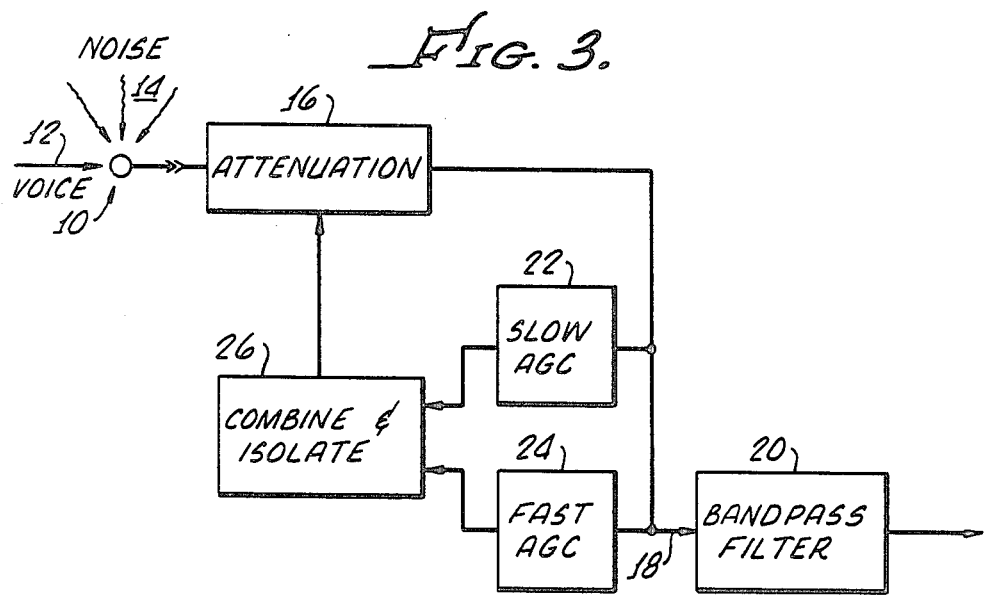
Figure 4A:
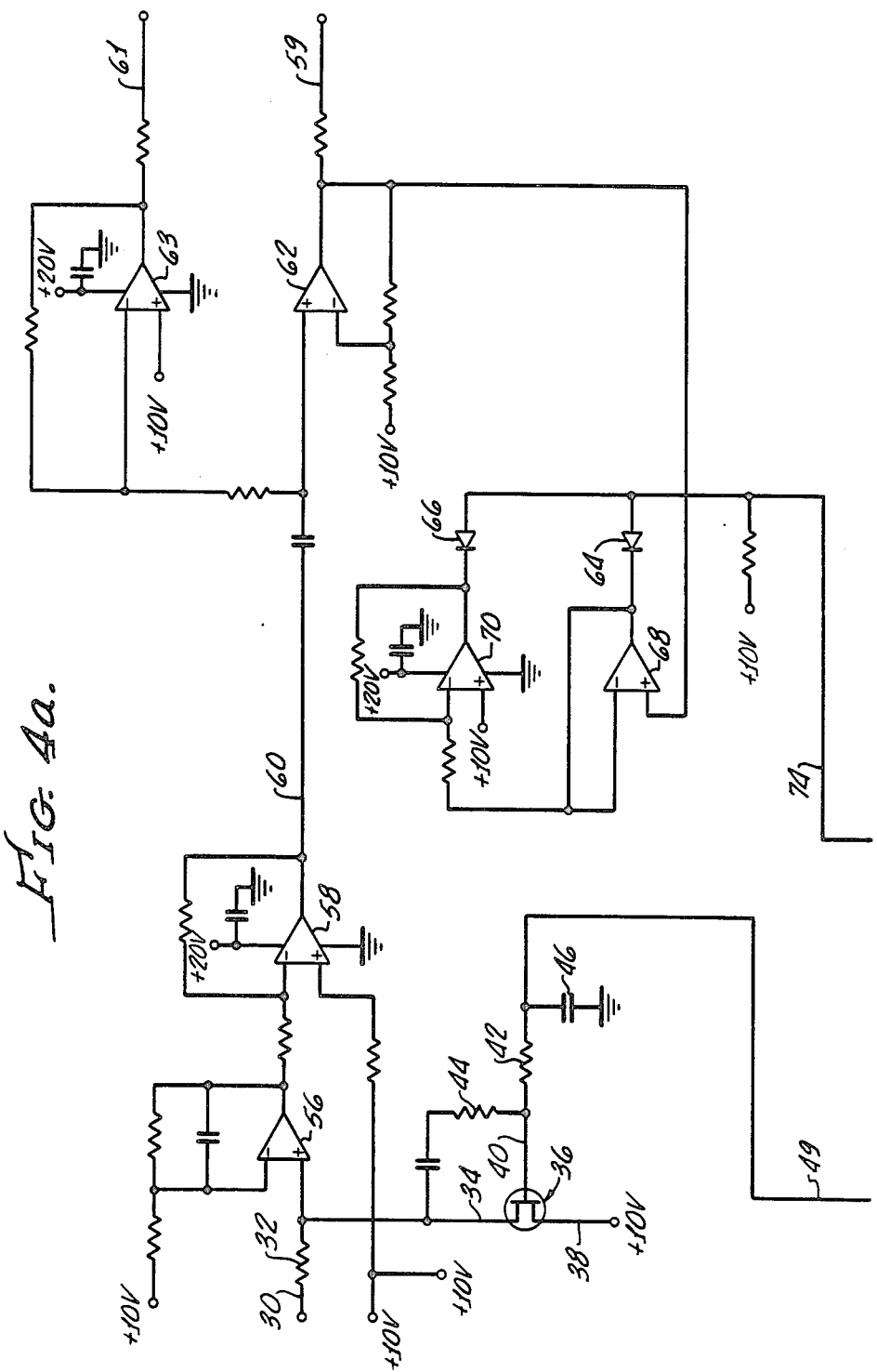
FIGS. 4a and 4b illustrate an exemplary implementation of the circuit of the system shown in FIG. 3.
Figure 4B:
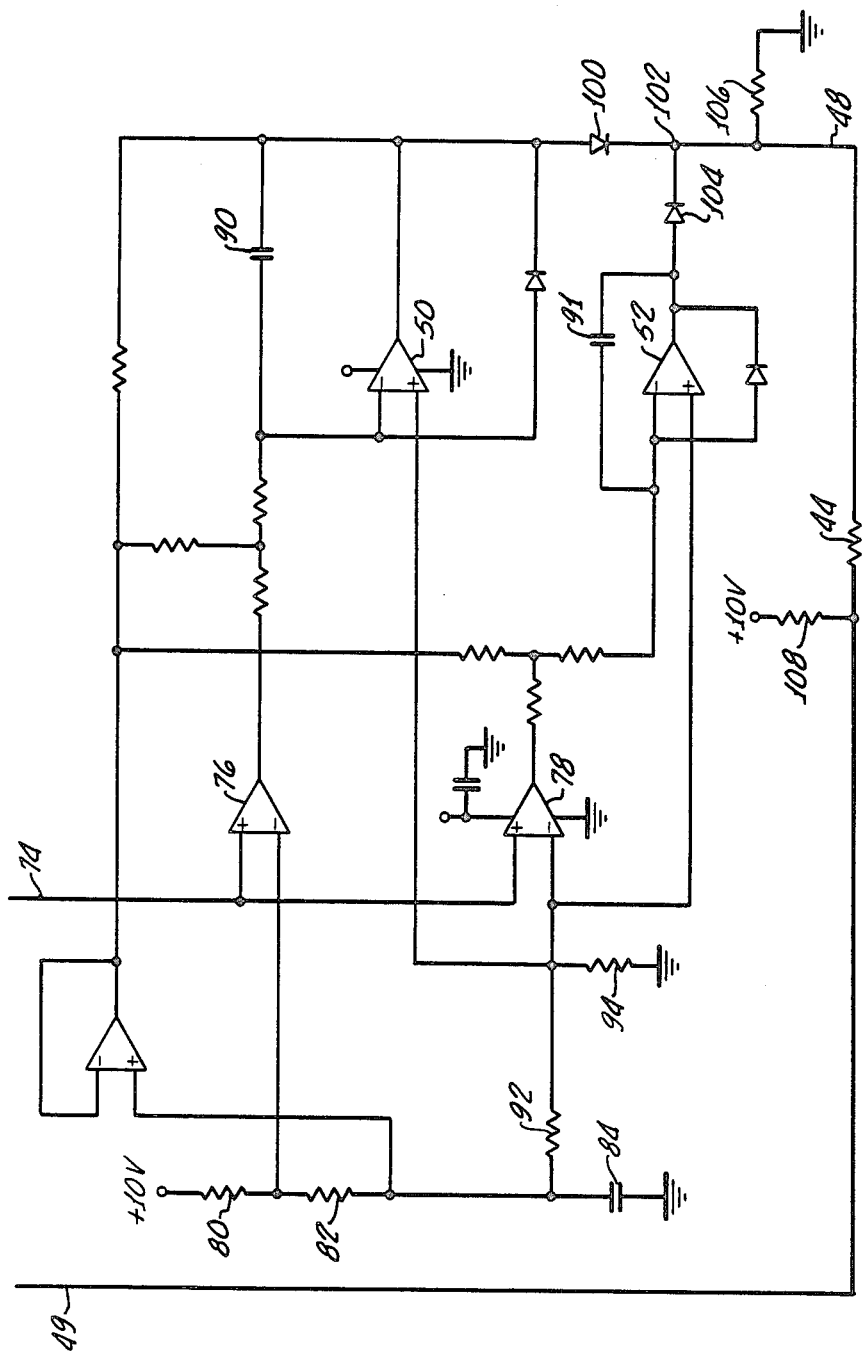

The described improvement of intelligibility is achieved by an arrangement functionally illustrated in FIG. 3, employing dual automatic gain control AGC circuits. Further details of circuitry, operation and design parameters of this system are shown in FIGS. 4a and 4b and discussed below. A noise canceling electret gradient microphone is schematically indicated at 10, receiving a voice input indicated at 12 and high level background noise indicated at 14. The electrical signal from the output of the microphone is fed to an attenuation circuit 16 from the output of which appears the range compressed and shaped signal on a line 18, which may be fed through a bandpass filter 20, if deemed necessary or desirable. The output of attenuator 16 is fed in parallel to slow and fast AGC circuits 22 and 24, of which the outputs are combined in a summing and isolating circuit 26 for return to and control of attenuator 16.

Slow AGC circuit 22 is a slow loop or integration circuit which compresses the wide dynamic range output of the microphone by an amount sufficient to match the input range of following communication channel circuitry in the communication system without distortive slipping. The threshold and time constant of the slow loop are set to provide attenuation related to the long term average of the background noise entering the microphone. the attenuation level of this slow AGC is set to provide enough attenuation so as to maintain linear action of the following communication channel circuitry without clipping when normal voice signal is added to the background noise.

The second automatic gain control circuit is a fast loop which is used in parallel with the slow AGC circuit. However, threshold and response time of this AGC circuit are set to allow an optimum amount of puff noise into the system so as to shape the puff noise and recreate underlying speech sounds. Thus this fast AGC circuit is set to selectively operate upon the higher level puff noise, and moreover, to shape this puff noise so as to extract intelligence from the phonemes that produce the puff noise.

By properly setting the threshold and response time of the fast AGC circuit, the leading edge of the plosive sounds (those produced by build up and sudden release of air) are preserved, while the excessive amplitude of the following or frication sounds, which build up more slowly, are reduced to a point where they are discernible by the human ear. In this manner speech information which is critical to intelligibility is extracted from a signal that is normally heard as noise.

The leading edge of the plosive sound normally has a rise time of approximately 5 milliseconds. To retain this plosive phoneme, the time constant of the fast AGC circuit is set in the range of about 30 to 100 milliseconds to provide an attenuation of approximately 1 dB for each 3 to 10 milliseconds. For example, with gain set for attenuation of 1 dB per 3 milliseconds, there is provided an attenuation of only about 2 dB after 6 milliseconds. Thus, for this fast AGC circuit, the 5 millisecond leading edge portion of the plosive experiences relatively little attenuation. However, attenuation continues to increase with this time constant, so that attenuation of portions of the signal following the plosive leading edge portion experience significantly greater attenuation. Therefore the puff noise is shaped to preserve its basic characteristics, to thereby maintain intelligibility of this portion of the sound. Output of the microphone for frication sound builds at about a time constant of 30 milliseconds, which is at a faster rate than the vowels, but the fast AGC circuit provides attenuation of these frication sounds, which are in the frequency range of 2 to 6 Kilohertz, and thus not attenuated by the noise canceling properties of the microphone.

To enable the fast AGC circuit to discriminate and to be selectively operable on the puff noise (and to effectively ignore the other phonemes such as vowels) it is provided with a significantly higher threshold than is provided for the slow AGC circuit. Accordingly, the fast AGC will operate only on the higher amplitude portions of the output signal (which represent plosive and fricative phonemes), whereas the slow AGC circuit, which is set to provide general suppression of the broad band of background noise, is operable over a much broader range of signal amplitudes, including the lower signal amplitudes of background noise and vowels.

The result of the fast AGC action reduces or eliminates the puff noise phenomenon and shapes the phonemes responsible for the puff noise. The shaping of the high amplitude puff noise provides critical speech information in the region of 2.5 Kilohertz to 6 Kilohertz, where the microphone provides little or no audio cancellation of the background noise. By reducing the signal levels associated with the puff noise, at a proper rate, the human ear can distinguish between the various speech sounds that are producing the puff noise. This process in turn increases intelligibility of the speech being transmitted to the communication channel.

The attenuation stages in the described process are capable of reducing peak amplitudes encountered from the microphone to a level which is within the linear region of the subsequent circuitry without any clipping action. The dual AGC action reduces the need for high gain bandwidth circuitry in the attenuator. The slow AGC loop provides the majority of required attenuation of background noise, thereby reducing the amount of attenuation needed at the higher frequencies by the fast AGC loop. This reduces cost and complexity of the circuit.

The slow AGC circuit is set to have a threshold of approximately 18 to 20 dB below the maximum limit of the following communication channel circuitry. This slow AGC is provided with a relatively slow attack and slow release time, which, in a particular example is a 700 millisecond attack time constant and about a 5 second release time constant. The rate of attenuation change provided by the various implementations of the slow AGC circuits is in the range of about 1 dB for each 100 to 520 milliseconds.

The fast AGC, on the other hand, is set to have a threshold that is considerably higher than that of the slow AGC circuit to enable this circuit to come into operation only for the much higher level components of the puff noise. This fast AGC threshold is set to about 6 to 10 dB below the maximum limit of the following communication channel circuitry. As previously mentioned, the fast AGC circuit is set to provide an attenuation of approximately 1 dB for each 3 to 10 milliseconds, and is provided with a shorter attack time constant of about 30 to 100 milliseconds. An attack time constant of 50 to 80 milliseconds is preferred, at present, for an M-162 first order gradient electret microphone. Preferably release time of the fast AGC is very short. In the analog embodiment to be described below the release time of the fast AGC is practically instantaneous.

Bandpass filter 20 is employed where the system is to be used in conjunction with a digital communication system so as to preserve speech signals in the speech spectrum of 150 Hertz to 6 Kilohertz frequency range, while minimizing adverse effects of noise outside the speech spectrum.

It will be readily appreciated that many types of circuits, either analog, digital, or a combination of analog and digital, may be employed to implement the system that is functionally illustrated in FIG. 3. Both digital and analog automatic gain control circuits are known, and it is only necessary to provide such circuits with threshold levels, time constants, and attenuation rates established as described herein so that the slow AGC loop will provide the majority of required attenuation, reducing the amount of attenuation needed at the higher frequencies by the fast AGC loop, with the circuits being further arranged so that the fast AGC loop will selectively attenuate and shape the speech signal components that have produced the high level puff noise in the microphone output. In fact several digital versions of this system have been built and operated successfully, but the described analog system shown in FIGS. 4a and 4b is presently preferred because it is less costly, and can be packaged in a smaller space.

FIGS. 4a and 4b are combined to show a single circuit by arranging FIG. 4a immediately above FIG. 4b. As illustrated in these figures, an input signal from the output of the microphone is provided on an input line 30 to one side of an input resistor 32, to the other side of which is connected the drain electrode 34 of a signal attenuating field effect transistor 36. The latter has its source electrode 38 connected to a positive potential, and its gate electrode 40 connected via resistors 42 and 44, and a grounded capacitor 46, to feedback lines 48,49 on which is received the output of a slow AGC amplifier 50 and a fast AGC amplifier 52. The output of the attenuating field effect transistor 36 is employed to attenuate and shape the signal at the output side of resistor 32. The combination of input resistor 32 and transistor 36 effectively form the attenuator of the described system. The attenuated and shaped signal is fed to the input of a first stage operational amplifier 56, and thence to a second stage operational amplifier 58, providing suitable gain of the attenuated and shaped input signal. From the cascaded amplifier stages 56,58 the signal is fed via a line 60 to the input of a third stage operational amplifier 62. Output of the system, the signal fed to the following communication channel circuitry, is provided on either of lines 59 or 61 from the non-inverted output of amplifier 62, or from the output of second stage operational amplifier 58 and the inverted output of an operational amplifier 63.

The output of amplifier 62 is full wave rectified by circuits including diodes 64 and 66. The signal from the output of amplifier 62 is fed to an amplifier 68 and thence through the first rectifying diode 64. The output of amplifier 68 is also fed to an operational amplifier 70 and thence through the second rectifying diode 66 to provide a full wave rectified signal on line 74. This rectified signal is fed in parallel to threshold setting operational amplifiers 76 and 78 of the slow and fast AGC amplifiers 50 and 52 respectively. This incoming signal to threshold setting amplifier 76 is fed to its non-inverting input, whereas its inverting input receives a threshold level established by a resistive voltage divider formed by resistors 80 and 82 connected in series between a grounded capacitor 84 and a 10 volt source of positive potential. The output of threshold setting amplifier 76 is fed to the inverting input of slow AGC amplifier 50, which is provided with a feedback path including a relatively large integrating capacitor 90.

The fast AGC threshold setting amplifier 78 has the rectified signal on line 74 provided to its non-inverting input and is provided with a threshold setting potential at its inverting input from the output of a voltage divider including resistors 92 and 94 which are connected together. The other end of resistor 94 is connected to ground and the other end of resistor 92 is connected to positive potential via the voltage dividing resistors 80,82.

The outputs of the two AGC amplifiers 50 and 52 are combined and mutually isolated from one another by means of a first isolating diode 100, connected between a junction point 102 on feedback line 49 and the output of slow AGC amplifier 50, and a second isolating diode 104, connected between junction point 102 and the output of fast AGC amplifier 52.

Although the outputs of the slow and fast AGC amplifiers 50 and 52 are combined at their common connection to junction point 102 on feedback line 49, the two AGC circuits are isolated from each other by the respective diodes 100, 104, which, in effect, provide an analog OR circuit. The diodes operate to allow one or the other of the outputs of amplifiers 50 and 52 to pass, passing only that one of the outputs which has the higher amplitude. Thus, if the output of slow AGC amplifier 50 is higher than the output of fast AGC amplifier 52, diode 100 conducts, and diode 104 is cut off to block the output of the fast AGC amplifier. Conversely, if the output of the fast AGC amplifier is higher than the output of the slow AGC amplifier, diode 104 conducts to cut off diode 100 and thereby block the output of the slow AGC amplifier. Moreover, this OR action of the isolating diodes effectively isolates each AGC circuit from the other. The slow AGC circuit is provided with a relatively large feedback capacitor 90, which may be on the order of 0.47 microfarads in an exemplary circuit, whereas the fast AGC circuit has a feedback capacitor 91 that is considerably smaller and may be on the order of 0.1 microfarads, in such exemplary embodiment. Thus, isolating diode 100 prevents the output of fast AGC amplifier 52 from charging the large capacitor 90, and therefore, enables the fast AGC circuit to maintain its very fast release time, unaffected by the longer discharge time of the larger capacitor 90. Capacitors 90 and 91 both discharge through a grounded resistor 106 connected to junction point 102.

It is important to recall that in this operation the two AGC circuits have different amplitude threshold values. As previously mentioned, the fast AGC circuit has a much higher amplitude threshold (established by divider 92,94 and amplifier 78) so that this circuit will be effective only for the high level sounds, and in particular for those indicated by the puff noise of FIG. 2b-3. For overall noise suppression it is desired to start the AGC action at a lower level. Thus the amplitude threshold of the slow AGC amplifier 50 is set to a considerably lower level, as previously stated. Thus the majority of the gain control is provided by the slow AGC circuit. When, and only when, the signal level reaches the higher threshold of the fast AGC circuit does the latter begin to operate. Thus, for example, at relatively low levels, below the threshold of fast AGC threshold amplifier 78, but above the threshold of the slow AGC threshold amplifier 76, an output is provided from the slow AGC amplifier 50, which begins to charge its relatively large feedback capacitor 90 and provides an attenuation signal (the negative feedback signal on feedback lines 48,49) to the gate of the attenuating field effect transistor 36. This signal on line 49 is higher than the output of fast AGC amplifier 52 (which is providing no output at this relatively low input signal level), and thus the latter is cut off and the system operates solely with the slow AGC, having its relatively slow release as provided by feedback capacitor 90.

However, when signal amplitude exceeds the higher threshold of fast AGC threshold amplifier 78, the output of amplifier 52 rises and may become greater than the output of slow AGC amplifier 50, to thereby cut off the output of the slow AGC amplifier and allow the fast AGC amplifier to take over at these higher signal levels. At such higher levels the fast AGC circuit operates by itself, and the slow AGC circuit is effectively blocked. This continues until the output of fast AGC amplifier 52 drops below the level of the output of slow AGC amplifier 50. When this occurs the fast AGC action ceases substantially instantaneously because of the OR action of the diodes 100, 104. In the absence of the isolation function provided by diode 100, the fast AGC circuit, in the presence of high level signals and because of its fast attack, would provide a relatively fast attenuation of the input to first stage amplifier 56, and then this fast AGC circuit (in the absence of diode 100) would also saturate the system and the feedback loop. Thus the high attenuation provided by the initial action of amplifier 52 would continue to operate (capacitor 90 would remain at a relatively high charge because of its slower discharge through a grounded resistor 106) and the circuit would be overdriven to a point that all subsequent speech would also be suppressed, including vowels. In other words, without the presence of diode 100 to isolate the slow AGC capacitor, the high level puff noise, including high level frication sound, would saturate the system, and it could take several seconds for the system to get down to where normal level signals would be allowed to pass. However, because of the presence of isolating diode 100 between the outputs of the slow and fast AGC amplifiers 50 and 52, the high level puff noise, which causes the fast AGC circuit to push the gain down very quickly, saturating the relatively small and more rapidly dischargeable feedback capacitor 91 of the fast AGC amplifier, cannot also charge feedback capacitor 90 of the slow AGC, and thus, the fast AGC does not affect the slow AGC.

Additional control of release time of the AGC circuits is also provided by resistor 44 and capacitor 46 in the feedback lines 48,49. As the feedback signal at junction point 102 increases, capacitor 46 is charged through resistor 44, which is biased from a source of positive potential by means of a resistor 108. Release time of capacitor 46 may be about 400 to 500 milliseconds, which is considerably less than release time of the slow AGC circuit. When charge on fast AGC capacitor 91 reaches a peak and the fast AGC input drops below its threshold, operation of the fast AGC amplifier ceases instantaneously, but decay of the feedback signal at the gate of attenuator 36 may be still controlled by the relatively fast discharge of capacitor 46.

The described analog implementation of the fast and slow AGC system, adjusted with thresholds and time constants as described above, is presently preferred for a specific application in which an analog system capable of being packaged in a very small space is desired. However, it will be readily appreciated that the described circuit may be implemented by other analog systems and by digital systems which can perform the functions or equivalents of the fast and slow AGC circuits described herein.

What is claimed is:

1. For use with an electret microphone that has an output signal of increased dynamic range and includes high amplitude puff noise produced by plosive, fricative and affricative speech components, apparatus for increasing intelligibility of the microphone output signal comprising:
    an attenuator circuit having an input coupled with the output of the microphone, and having an output, and
    feedback means including first and second AGC circuits connected between said attenuator circuit output and the attenuator circuit, said first AGC circuit including means for selectively shaping the puff noise to preserve leading edges of plosive sound components and to attenuate higher level frication sound components.

2. The apparatus of claim 1 wherein said second AGC circuit includes means for decreasing dynamic range of said attenuator circuit output.

3. The apparatus of claim 1 wherein said first AGC circuit includes fast circuit means for selectively passing, with relatively little attenuation, signals having a rise time substantially equal to the rise time of plosive speech components.

4. The apparatus of claim 1 wherein said first AGC circuit includes fast AGC circuit means for passing, with relatively little attenuation, signals having a rise time of about five milliseconds, thereby preserving shape of plosive signal components.

5. The apparatus of claim 1 wherein said first AGC circuit has a relatively high threshold and wherein said second AGC circuit has a relatively low threshold.

6. The apparatus of claim 5 wherein said second AGC circuit has a relatively slow attack and slow release time, and wherein said fast AGC circuit has a fast attack and fast release time.

7. The apparatus of claim 6 including means for isolating the second AGC circuit from the first AGC circuit.

8. The apparatus of claim 1 wherein said AGC circuits are connected in parallel, wherein said first AGC circuit has a fast attack time and a substantially instantaneous release time, and wherein said second AGC circuit has a slower attack time and a slow release time, and means for preventing the first AGC circuit from affecting operation of the second AGC circuit.

9. A method for improving voice intelligibility in the output of a microphone used in a high noise environment, wherein the microphone output includes signal components of a wide dynamic range including vowel speech component signals of high amplitude and puff noise of still higher amplitude formed in part from plosive, fricative and affricative speech components, said method comprising the steps of:
    providing a relatively slow AGC circuit for suppressing background noise,
    providing a relatively fast AGC circuit for shaping and attenuating said puff noise of still higher amplitude, and
    employing said AGC circuits to modify the output signal of the microphone so as to compress its dynamic range and to shape signal components resulting from plosives, fricatives and affricatives.

10. The method of claim 9 including the step of causing said relatively slow AGC circuit to operate in response to signal levels of a first threshold value and causing said relatively fast AGC circuit to operate in response to signal levels of a second threshold value that is higher than said first threshold value.

11. The method of claim 9 including the step of isolating one of said AGC circuits from the other.

12. The method of claim 9 including the step of attenuating the microphone output signal in accordance with the output of one or the other of said fast and slow AGC circuits.

13. The method of claim 12 including the step of preventing operation of said fast AGC circuit from affecting operation of the slow AGC circuit.

14. The method of claim 9 including the step of operating the fast AGC circuit to provide relatively less attenuation of the leading edge of a signal having a fast rise time and to provide relatively greater attenuation for a following portion of such signal.

15. The method of claim 9 including the steps of attenuating the microphone output in accordance with said fast and slow AGC circuits, causing the fast AGC circuit to increase its attenuation of microphone output at a rate greater than the rate of increase of attenuation of microphone output caused by the slow AGC circuit and to decrease its attenuation of microphone output at a rate greater than the rate of decrease of attenuation caused by the slow AGC circuit.

16. The method of claim 15 including the step disabling said slow AGC circuit at signal levels below a first threshold value and disabling said fast AGC circuit at signal levels below a second threshold level that is higher than said first threshold level.

17. The method of claim 9 including the step of causing said slow AGC circuit to attenuate microphone output at a rate of about 1 dB for approximately each 100 to 500 milliseconds and causing said fast AGC to attenuate microphone output signal at a rate of approximately 1 dB for each 3 to 10 milliseconds.

18. The method of claim 17 including the step of disabling said slow AGC circuit for signal levels below a level of about 18 to 20 dB below a selected maximum output limit and for disabling said fast AGC for signals below a level of about 6 to 10 dB below said maximum output limit.

19. The method of claim 18 including the step of providing said slow AGC circuit with a 700 millisecond attack time and a release time in the order of 5 seconds, and providing said fast AGC circuit with an attack time in the range of about 30 to 100 milliseconds and an effectively instantaneous release time.

20. A system for improving voice intelligibility of the output of an electret gradient microphone which output includes a wide dynamic range of signal components, including components representative of vowel sounds and puff noise components caused by plosives, fricatives and affricatives, said system comprising:
 signal attenuator means responsive to the output of the microphone for attenuating and shaping a signal and for providing an output to following circuitry,
 first AGC circuit means responsive to said attenuator means output for controlling the attenuator means to shape the puff noise caused by plosives, fricatives, and affricatives and
 second AGC circuit means responsive to said attenuator means output for controlling said attenuator means to compress the dynamic range of the output signal.

21. The system of claim 20 including threshold means for causing said first AGC circuit means to selectively respond to plosive and frication sound signal components of higher amplitude.

22. The system of claim 21 wherein said threshold circuit means comprises means for establishing a relatively high threshold for said first AGC circuit means to thereby effectively disable the first AGC circuit means for input signal levels below said high threshold, and including means for establishing a low threshold for said second AGC circuit means lower than said high threshold.

23. The system of claim 20 including means for coupling both of said AGC circuit means to said attenuator means and for isolating the output of at least one of said AGC circuit means from the other of said AGC circuit means.

24. The system of claim 20 wherein said second AGC circuit means has a relatively slow attack and slow release time and has a relatively low threshold, and wherein said first AGC circuit means has an attack time faster than the attack time of said second AGC circuit, has a fast release time, and has a threshold higher than the threshold of said second AGC circuit means.

25. The system of claim 20 wherein said first AGC circuit means has a relatively high threshold level and includes means for causing the system to pass a signal component with relatively less attenuation of leading portions of such signal component and relatively greater attenuation of subsequent portions of such signal component.

26. The system of claim 25 wherein said first AGC circuit means has an attack time that causes the circuit to provide relatively less attenuation of a rapidly rising leading edge of a plosive signal component and relatively greater attenuation of more slowly rising frication signal components.

27. The system of claim 20 wherein said first and second AGC circuit means each includes an amplifier having a feedback capacitor, and including means for isolating the feedback capacitor of at least one of said amplifiers from the output of the other of said amplifiers.

28. The system of claim 27 wherein said means for isolating includes first and second unidirectionally conducting devices connected respectively to outputs of respective ones of said amplifiers and means for connecting said unidirectional conducting devices to said attenuator means.

29. The system of claim 20 wherein said second AGC circuit means comprises a slow AGC amplifier having a relatively low level threshold and having a relatively large feedback capacitor, said first AGC circuit means comprising a fast AGC amplifier having a threshold level greater than said second mentioned threshold and having a feedback capacitor smaller than said first mentioned feedback capacitor, a first diode having one side connected to said slow amplifier, and a second diode having one side connected to said fast amplifier and having the other side thereof connected to the other side of said first diode and to said attenuator means.

30. For use with a noise canceling electret gradient microphone which, when used in very high noise environments, produces an output signal having a wide dynamic range and having puff noise, said puff noise being caused by operation of the microphone upon plosive, fricative and affricative speech components and having a significant energy content in frequency regions above regions in which the microphone exhibits its noise canceling qualities, a signal processing system for improving voice intelligibility comprising:
 an attenuator having an input from the output of the microphone and having an output,
 a slow AGC circuit connected between the output of the attenuator and the attenuator, and including means for compressing dynamic range of the microphone output, and
 a fast AGC circuit connected between the output of the attenuator and the attenuator, said fast AGC circuit including means selectively operable upon said puff noise for shaping the puff noise so as to provide plosive, fricative and affricative signal components representative of the signal components causing such puff noise.

31. The apparatus of claim 30 including means for isolating the slow AGC circuit from the fast AGC circuit.

32. The system of claim 30 including means for preventing saturation of the slow AGC circuit by the output of the fast AGC circuit.

33. The system of claim 30 wherein said slow AGC circuit has a relatively low threshold and a slow release, and wherein said fast AGC circuit has a relatively high thresehold and a fast release.

34. The system of claim 30 wherein said slow AGC circuit includes a slow AGC amplifier having a first feedback capacitor and wherein said fast AGC circuit includes a fast AGC amplifier having a second feedback capacitor, and including means for isolating said amplifiers from one another, said isolating means comprising a first diode connected between the output of the first amplifier and the output of the second amplifier, and a second diode connected between said first diode and the output of said second amplifier.

35. The system of claim 30 wherein said slow circuit has a relatively low threshold, a relatively slow attack time and a slow release time, and wherein said fast AGC circuit has a relatively high threshold, an attack time faster than said first mentioned attack time, and a fast release time.

36. The system of claim 30 wherein said slow AGC circuit has a threshold in the order of about 18 to 20 dB below a preselected maximum limit of following circuitry, has an attenuation of about 1 dB for each 100 to 500 milliseconds, and wherein said fast AGC circuit has a threshold in the order of about 6 to 10 dB below said maximum limit and has an attenuation of about 1 dB for each 3 to 10 milliseconds.

37. The system of claim 36 including means for isolating the slow AGC circuit from the output of said fast AGC circuit, thereby retaining the fast release time of the fast AGC circuit, independent of the slow AGC circuit, and preventing the output of the fast AGC circuit from modifying operation of the slow AGC circuit.

* * * * *